(12) United States Patent
Zurek

(10) Patent No.: US 11,009,537 B2
(45) Date of Patent: May 18, 2021

(54) FLEXIBLE CURRENT SENSOR

(71) Applicant: Megger Instruments Ltd., Dover (GB)

(72) Inventor: Stanislaw Zurek, Dover (GB)

(73) Assignee: Megger Instruments Ltd., Dover (GB)

( * ) Notice: Subject to any disclaimer, the term of this patent is extended or adjusted under 35 U.S.C. 154(b) by 77 days.

(21) Appl. No.: 16/676,843

(22) Filed: Nov. 7, 2019

(65) Prior Publication Data

US 2020/0072883 A1 Mar. 5, 2020

Related U.S. Application Data

(63) Continuation of application No. PCT/GB2018/051252, filed on May 10, 2018.

(30) Foreign Application Priority Data

May 10, 2017 (GB) ...................................... 1707517

(51) Int. Cl.
| | |
|---|---|
| *G01R 27/26* | (2006.01) |
| *G01R 27/08* | (2006.01) |
| *G01R 15/18* | (2006.01) |
| *G01R 19/00* | (2006.01) |

(52) U.S. Cl.
CPC ............ *G01R 27/26* (2013.01); *G01R 15/183* (2013.01); *G01R 19/0092* (2013.01); *G01R 27/08* (2013.01)

(58) Field of Classification Search
CPC ........ G01R 27/00; G01R 27/02; G01R 27/08; G01R 27/26; G01R 19/00; G01R 19/0084; G01R 19/0092; G01R 15/00; G01R 15/14; G01R 15/18; G01R 15/181; G01R 15/183; G01R 15/186

USPC ......... 324/600, 649, 691, 713, 76.11, 117 R, 324/117 H; 340/657, 664; 361/93.6; 702/1, 33, 35, 38, 57, 64
See application file for complete search history.

(56) References Cited

U.S. PATENT DOCUMENTS

| | | | | |
|---|---|---|---|---|
| 3,748,570 | A | * 7/1973 | Martner | .................. H01F 29/00 323/329 |
| 4,048,605 | A | 9/1977 | McCollum | |
| 6,160,697 | A | * 12/2000 | Edel | ...................... G01R 15/185 361/143 |

(Continued)

FOREIGN PATENT DOCUMENTS

| | | |
|---|---|---|
| EP | 2993678 A1 | 3/2016 |
| WO | 0039820 A1 | 7/2000 |

OTHER PUBLICATIONS

Ren et al., "Research of a Novel Rogowski Coil With Special Magnetic Core", Precision Electromagnetic Measurements Digest, 2008, CPEM 2008, IEEE, 2008.

(Continued)

*Primary Examiner* — Hoai-An D. Nguyen
(74) *Attorney, Agent, or Firm* — EIP US LLP

(57) ABSTRACT

A flexible electrical current sensor is provided, the flexible electrical current sensor comprising a solenoid disposed about an at least partially magnetic core. The at least partially magnetic core comprises at least one magnetic element. The at least one magnetic element is configured to provide one or more regions of overlap such that a respective gap is provided in each region of overlap. Each respective gap is configured such that the effective magnetic permeability of the at least partially magnetic core is maintained during flexing.

20 Claims, 12 Drawing Sheets

(56) References Cited

U.S. PATENT DOCUMENTS

| | | | |
|---|---|---|---|
| 6,782,329 B2* | 8/2004 | Scott | H02H 1/0015 |
| | | | 702/58 |
| 8,203,328 B2* | 6/2012 | Bose | G01R 1/22 |
| | | | 324/117 H |
| 2004/0201373 A1 | 10/2004 | Kato | |
| 2008/0129284 A1* | 6/2008 | Hu | G01R 15/202 |
| | | | 324/207.2 |
| 2010/0301852 A1* | 12/2010 | Teppan | G01R 15/18 |
| | | | 324/253 |
| 2011/0140694 A1 | 6/2011 | Cima et al. | |
| 2014/0062459 A1 | 3/2014 | El-Essawy et al. | |
| 2014/0333284 A1 | 11/2014 | Dames et al. | |

OTHER PUBLICATIONS

United Kingdom Search Report dated Aug. 23, 2017 for GB Application No. 1707517.7.
International Search Report and Written Opinion dated Oct. 8, 2018 for PCT Application No. PCT/GB2018/051252.
Alves et al., "High-frequency behaviour of magnetic composites based on FeSiBCuNb particles for power electronics", IEEE Trans. Magnetics, vol. 38 (5), 2002, p. 3135.

* cited by examiner

FLEXIBLE CURRENT SENSOR

CROSS-REFERENCE TO RELATED APPLICATIONS

This application is a continuation of International Application No. PCT/GB2018/051252, filed May 10, 2018 which claims priority to UK Application No. GB 1707517.7, filed May 10, 2017, under 35 U.S.C. § 119(a). Each of the above referenced patent applications is incorporated by reference in its entirety.

BACKGROUND OF THE INVENTION

Field of the Invention

The present invention relates to a flexible electrical current sensor, in particular a flexible electrical current sensor with a solenoid disposed about an at least partially magnetic core having an effective magnetic permeability that is maintained during flexing.

Description of the Related Technology

Flexible current sensors, in the form of a Rogowski coil (herein "RC"), have been known since the end of the 19$^{th}$ century and are commonly used today for measuring electrical currents. Modern versions typically have a non-magnetic core, for example made from silicon rubber or plastic.

F. Alves, "High-frequency behaviour of magnetic composites based on FeSiBCuNb particles for power electronics", *IEEE Trans. Magnetics*, Vol. 38 (5), 2002, p. 3135 describes a structure with magnetic flakes dispersed in a non-magnetic matrix.

Ren, Shiyan, Jiang Cao, and Huayun Yang. "Research of a novel Rogowski coil with special magnetic core." *Precision Electromagnetic Measurements Digest, 2008. CPEM 2008. Conference on*. IEEE, 2008 describes a Rogowski coil with a core having embedded particles.

SUMMARY

According to an aspect of the present invention, there is provided a flexible electrical current sensor comprising a solenoid disposed about an at least partially magnetic core, the at least partially magnetic core comprising at least one magnetic element, wherein the at least one magnetic element is configured to provide one or more regions of overlap such that a respective gap is provided in each region of overlap, each respective gap being configured such that the effective magnetic permeability of the at least partially magnetic core is maintained during flexing.

This allows the core, and the flexible current sensor as a whole, to have an effective magnetic permeability that is controllable at the design stage, by the design of the positioning and overlap of the at least one magnetic element, and that is maintained during flexing of the flexible current sensor. The effective magnetic permeability of the present flexible current sensor may therefore have greater controllability and predictability than known current sensors, while flexibility of the current sensor allows it to be useful in a wide range of applications involving measurement of electrical current.

In some embodiments of the invention, each respective gap is configured to maintain a substantially constant volume of the respective region of overlap provided by the at least one magnetic element.

In some embodiments of the invention, the at least partially magnetic core comprises a plurality of magnetic elements, and the magnetic elements are arranged in at least one layer disposed on a flexible non-magnetic substrate. This allows the core, and the current sensor as a whole, to be flexible while having an effective magnetic permeability that is controllable by the positioning of the magnetic elements on the non-magnetic substrate.

In some embodiments of the invention, the at least partially magnetic core comprises a first layer of magnetic elements disposed on a first side of the flexible non-magnetic substrate, and further comprises a second layer of magnetic elements disposed on an opposite side to the first side of the flexible non-magnetic substrate. This allows the spacing, and thus magnetic coupling, between magnetic elements in the same and/or adjacent layer to be controllable. The effective magnetic permeability may therefore be set by the positioning of the magnetic elements, and maintained during flexing of the at least partially magnetic core.

In some embodiments of the invention, a ratio g/o of the average distance between the first and second layers of magnetic elements g, and the average overlap between magnetic elements in the first and second layers o, is maintained during flexing.

In some embodiments of the invention, the at least partially magnetic core comprises a plurality of magnetic elements and the magnetic elements are arranged in at least two layers such that each magnetic element in a layer overlaps with a magnetic element in an adjacent layer. Each magnetic element is arranged to pivot about a point in a region of overlap with another magnetic element. Pivoting of the magnetic elements relative to one another allows the current sensor to be flexible, while the spacing of the layers, and of the magnetic elements within the layers, allows the effective magnetic permeability of the at least partially magnetic core to be controllable.

In some embodiments of the invention, the flexible electrical current sensor comprises one magnetic element arranged substantially helically. In other embodiments of the invention, the flexible electrical current sensor comprises two magnetic elements arranged as intertwining strips.

In some embodiments of the invention, the solenoid comprises winding of a uniform pitch. This allows the current sensor to be more accurate, i.e. improves measurement uncertainty, due to the relationship between the current being measured and the output voltage.

In some embodiments of the invention, the magnetic element(s) have a relative magnetic permeability of at least 500. In some embodiments, the magnetic element(s) comprise magnetically soft material.

According to an aspect of the present invention there is provided a device to measure at least one of electrical resistance and electrical impedance. The device comprising a voltage-inducing loop and a current-sensing loop. At least one of the voltage-inducing loop and the current-sensing loop comprises a flexible electrical current sensor according to any embodiment. This may allow the device to be used to make a measurement of resistance or impedance of circuits involving earthing electrodes. By using current sensors according to embodiments of the invention measurements may have increased accuracy and versatility in testing points when compared with other devices.

Further features and advantages of the invention will become apparent from the following description of preferred embodiments of the invention, given by way of example only, which is made with reference to the accompanying drawings.

BRIEF DESCRIPTION OF THE DRAWINGS

The invention will now be described, by way of example only, with reference to the accompanying drawings, in which:

FIG. 4b is a schematic diagram of a top-down view of the flexible current sensor shown in FIG. 4a;

DETAILED DESCRIPTION OF CERTAIN INVENTIVE EMBODIMENTS

Figure 1:
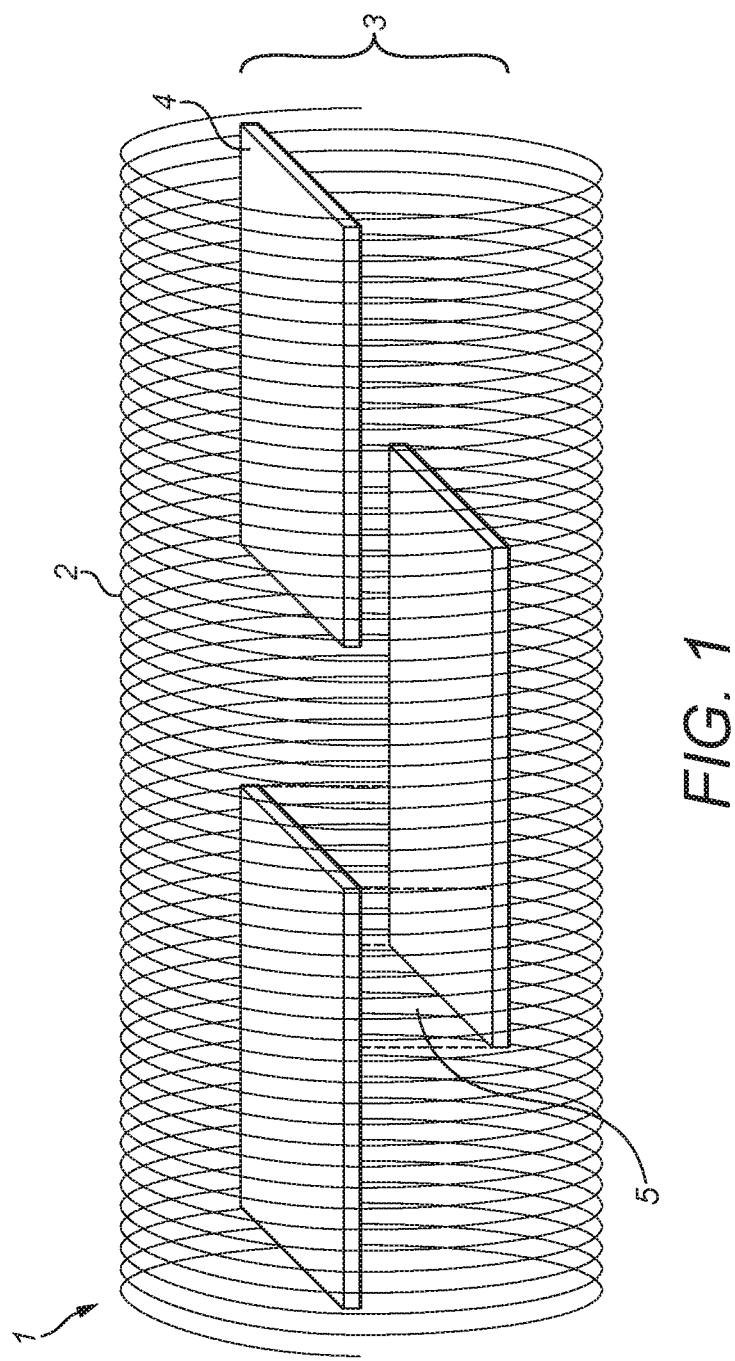
FIG. 1 is a schematic diagram of a perspective view of a flexible current sensor according to embodiments of the invention.

Embodiments of the invention are herein described with reference to the accompanying drawings. In the following description, for the purpose of explanation, numerous specific details of certain examples are set forth. Reference in the specification to "an example" or similar language means that a particular feature, structure, or characteristic described in connection with the example is included in at least that one example, but not necessarily in other examples. It should further be noted that certain examples are described schematically with certain features omitted and/or necessarily simplified for ease of explanation and understanding of the concepts underlying the examples.

Rogowski coils (RCs) are used mainly for measuring alternating currents (AC). They may provide reliable performance and linearity at currents of kilo-amperes (kA), in a wide frequency range up to megahertz (MHz). However, the non-magnetic core means that their sensitivity is relatively low and they typically cannot measure accurately below 1 ampere (A). For normal RC construction, 10 milli-amperes (mA) may be the lowest current measurable. Generally, the term "Rogowski coil" implies a sensor with a non-magnetic core. However, sensors with magnetic (or partially magnetic) cores may also be referred to as Rogowski coils.

The operation of Rogowski coils and the present flexible current sensor is based on a relationship between an input current passing through, and being measured by, the coil and a generated output voltage. With the relationship known, the output voltage can be measured and the input current inferred. This relationship may be given by:

$$V_{out} = \frac{A \cdot \mu_0}{l} \sum_i^N \left( \mu_r \cdot \frac{dI_{in}(t)}{dt} \right)_i$$

where $V_{out}$ is the output voltage, $dI_{in}(t)/dt$ is the time differential of the input current as a function of time $I_{in}(t)$, $\mu_r$ is the relative magnetic permeability of the medium, $\mu_0$ is the magnetic constant or magnetic permeability of vacuum, A is the cross-sectional area of the core about which turns of wire are wound, l is the magnetic path length, and the sum is over each turn i up to the total number of turns N. The sum of partial voltages, each partial voltage corresponding to the voltage through each turn i of the coil, may also be referred to as a space integral.

For better proportionality between the output voltage $V_{out}$ and input current $I_{in}(t)$, the other terms in the equation should be kept as constant as possible throughout the core of the current sensor. $\mu_0$ is a natural constant, while A and l are relatively straightforward to manufacture such that they are constant throughout the coil. Thus, a current sensor where $\mu_r$ is constant and the spacing between the turns of the coil is constant (uniform winding) would improve the measurement accuracy of a current.

The relative magnetic permeability of a material is related to a magnetic field strength H (measured in amps per metre) and a magnetic flux density B (measured in tesla) by $B = \mu_0 \mu_r H$. Thus, a constant $\mu_r$ gives a linear relationship between B and H.

Introducing an air gap into a magnetic core may reduce the magnetic permeability $\mu_r$ of the core while also increasing the linearity of the relationship between the magnetic field strength H and magnetic flux density B—sometimes referred to as a B-H curve or loop. The effective magnetic permeability $\mu_{eff}$ of such a magnetic core with a gap may be considered to be:

$$\mu_{eff} = \frac{\mu_{core}}{\frac{l_{gap}}{l_{core}} \mu_{core} + 1}$$

where $\mu_{Core}$ is the magnetic permeability of the core material, $l_{core}$ is the length of the core, and $l_{gap}$ is the length of the air gap. This equation is based on several assumptions, such as: the cross section area of the magnetic circuit is constant at every point of the circuit, and is the same for the core and for the gap; the length of the air gap is much shorter than the total path length of the magnetic core; the magnetisation is uniform and fringing effect is neglected; and the permeability of the core material is much greater than the permeability of air gap.

It is an object of the present invention to provide a current sensor that is flexible and has increased uniformity of effective magnetic permeability, even during flexing, such that measurements of low current (for example, current below 1 A) may be made with a higher value of certainty than known current sensors. For example, in current sensors where magnetic powder, particles or flakes is/are dispersed in a non-magnetic matrix or substrate, it may be difficult to determine with sufficient accuracy the number of such particles present in a given volume of material. The uniformity of such a structure must therefore be estimated by statistical averaging. In the present flexible current sensor, however, the uniformity of the structure is controlled by mechanical properties, and so may be determined and controlled to greater accuracy. The effective magnetic permeability of the present flexible current sensor may therefore have greater controllability and predictability.

FIGS. 1 to 6 show a flexible electrical current sensor 1 comprising a solenoid 2 disposed about an at least partially magnetic core 3. The at least partially magnetic core 3 comprises at least one magnetic element 4. The at least partially magnetic core 3 may, in some examples, comprise magnetic and non-magnetic parts and hence is referred to as at least partially magnetic. The at least partially magnetic core 3 may significantly increase sensitivity of the present current sensor compared to Rogowski Coils with non-magnetic cores, for example by a factor of around 30 to 50 times, or even exceeding 250 times for small currents.

The at least one magnetic element 4 is configured to provide one or more regions of overlap 5 such that a respective gap is provided in each region of overlap 5. A region of overlap may be a spatial region where at least two portions of a magnetic element 4, or at least two magnetic elements 4, overlap each other. The respective gap of each region of overlap 5 may be a geometrical function of a length of overlap, and a distance between the at least two portions of a magnetic element 4, or at least two magnetic elements 4, for example.

Compared with current sensors having a core comprising magnetic particles or flakes dispersed in a non-magnetic matrix, the positioning of the discrete magnetic element(s) 4 in the present flexible current sensor 1 may be controlled to greater precision. Thus, instead of an inhomogeneous distribution of magnetic particles, giving varying magnetic couplings between each pair of particles due to their varying non-uniform separations, the magnetic elements 4, or particular parts of a singular magnetic element 4, in the present flexible current sensor 1 may be positioned to a greater accuracy and precision relative to one another. This allows for a greater controllability and predictability of the effective magnetic permeability of the core structure 3.

Each respective gap is configured such that the effective magnetic permeability of the at least partially magnetic core 3 is maintained during flexing. In some examples, the effective magnetic permeability of the at least partially magnetic core 3 is much greater than 1, for example at least 500, which may improve the sensitivity of the flexible electrical current sensor 1 allowing smaller currents, for example 1 mA and below, to be measured. This provides a significant improvement in sensitivity over comparable RCs, with high-sensitivity RCs measuring currents in the order of 10 mA. In an example, the effective magnetic permeability of the at least partially magnetic core 3 is at least 2. In other examples, the effective magnetic permeability of the at least partially magnetic core 3 is approximately 30, or 100.

In certain cases, the effective magnetic permeability of the at least partially magnetic 3 core is maintained during flexing to within 1%, 2% 3%, 4%, 5%, or less than 10% of an effective magnetic permeability value when the core 3 is at rest or unflexed.

In some embodiments, each respective gap is configured to maintain a substantially constant volume of the respective region of overlap 5 provided by the at least one magnetic element 4. For example, a volume of the respective region of overlap 5 may be delimited by the dimensions of the respective region of overlap 5, such as the overlapping area of the magnetic elements 4, or portions of a magnetic element 4, and a distance between the magnetic elements 4, or portions of a magnetic element 4.

In some embodiments, each respective gap comprises no electronics or electronic components, for example a transducer or sensor. In other words, such electronic components are absent from each respective gap provided in each region of overlap 5, and in particular active electronic components are absent from each respective gap provided in each region of overlap 5.

Figure 2:
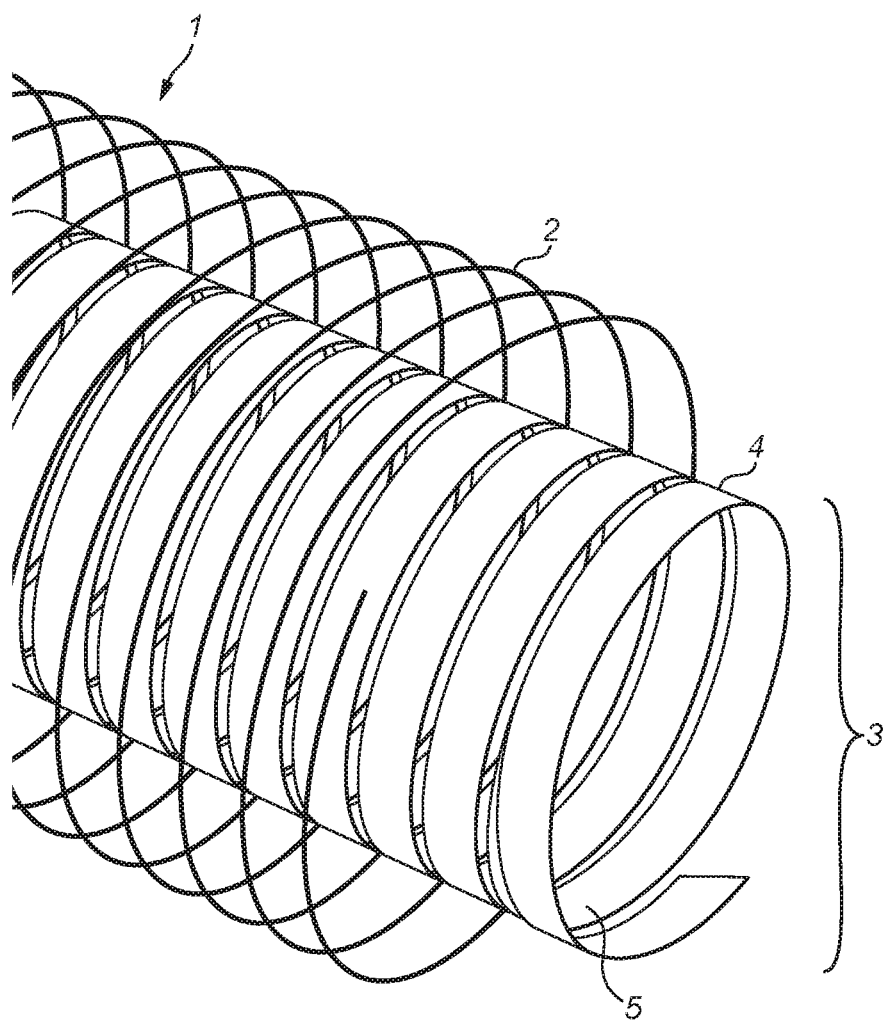
FIG. 2 is a schematic diagram of a perspective view of a flexible current sensor according to embodiments of the invention.

FIG. 2 shows an embodiment where the at least partially magnetic core 3 comprises one magnetic element 4 arranged substantially helically. The magnetic element 4 is configured to provide regions of overlap 5 where the magnetic element 4 overlaps itself in its helical arrangement. The substantially helical arrangement of the magnetic element 4 may in some examples have a substantially circular cross-section, but in other examples have a non-circular cross-section. For example, the cross-section of the helix that the magnetic element 4 traces may be elongated or "flattened".

Figure 3:
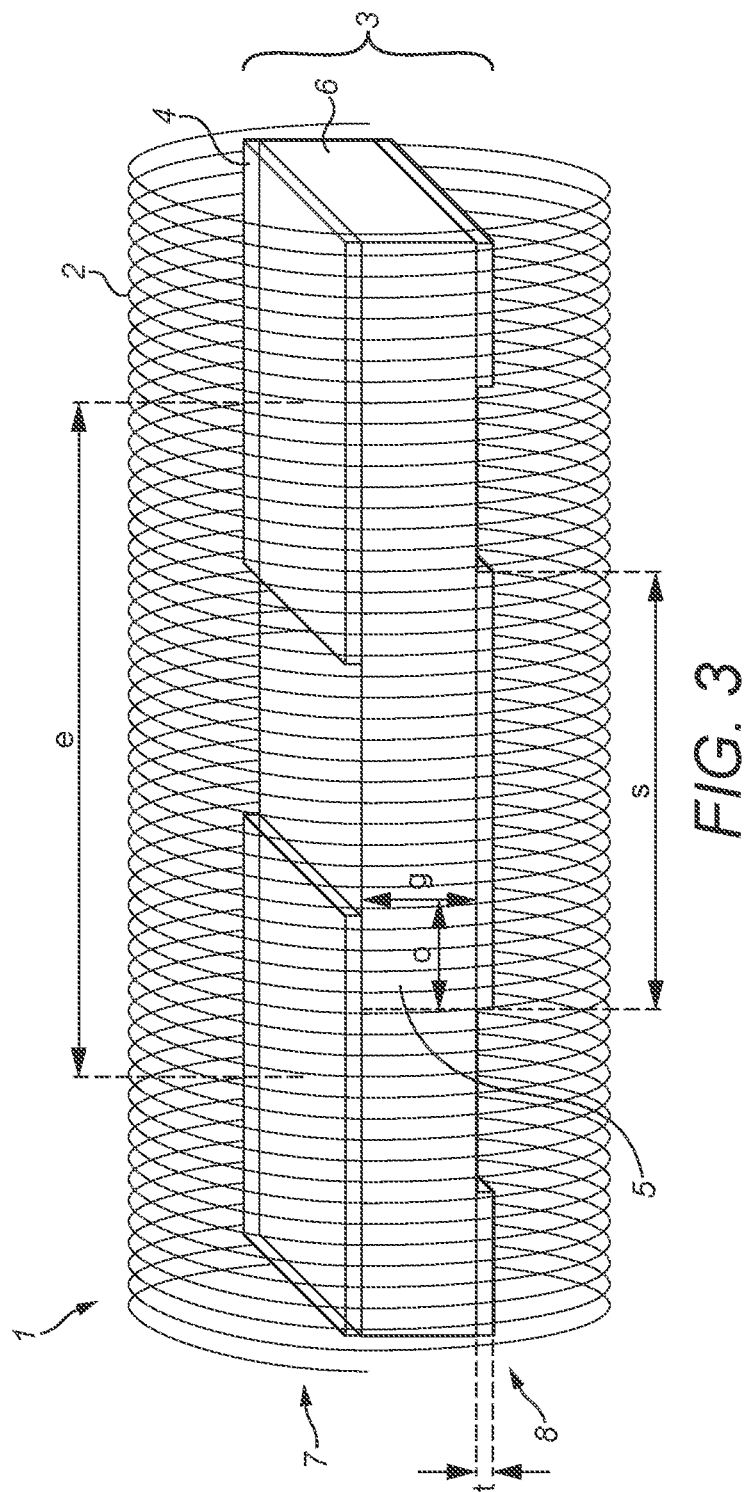
FIG. 3 is a schematic diagram of a perspective view of a flexible current sensor according to embodiments of the invention.

FIG. 3 shows an embodiment with the at least partially magnetic core 3 comprising a flexible non-magnetic substrate 6. The flexible non-magnetic substrate may be, for example, polycarbonate plastic tape. In some examples of this embodiment, the flexible non-magnetic substrate 6 is between 0.01 and 1.0 mm in thickness. In examples of larger sensors, the flexible non-magnetic substrate 6 may be greater than 10 mm in thickness.

The at least partially magnetic core 3 may comprise a plurality of magnetic elements 4, with the magnetic elements 4 arranged in at least one layer disposed on the flexible non-magnetic substrate 6. The magnetic elements 4 may be affixed to the flexible non-magnetic substrate 6 by an adhesive, for example the flexible non-magnetic substrate 6 may have an adhesive layer. The magnetic elements 4 may be metallic strips in certain cases.

In the embodiment shown in FIG. 3, the at least partially magnetic core 3 comprises a first layer 7 of magnetic elements 4 disposed on a first side of the flexible non-magnetic substrate 6, and a second layer 8 of magnetic elements 4 disposed on an opposite side to the first side of the flexible non-magnetic substrate 6. In other embodiments, the at least partially magnetic core 3 may comprise multiple layers of magnetic elements 4 disposed on opposite sides of the flexible non-magnetic substrate 6. The at least partially magnetic core 3 having two layers 7, 8 as shown in FIG. 3 may be beneficial for manufacturing. The relative magnetic permeability µ of the magnetic elements 4 may be greater than 500 or 1000 in some examples, and preferably at least 10,000. The magnetic field is guided along a magnetic element 4, because it is energetically much easier for the field to flow inside of a high-µ magnetic element than through the non-magnetic substrate 6. However, the magnetic elements 4 have finite length and so at the end of the element 4, the field is forced to jump across to the next high-µ magnetic element via the shortest possible path, which will start and end perpendicularly to the surfaces of adjacent magnetic elements 4.

In another embodiment, the at least partially magnetic core 3 comprises a plurality of magnetic elements 4 arranged in at least one layer 7, 8 and disposed at least partially within the flexible non-magnetic substrate 6. For example, instead of the magnetic elements 4 being disposed on a surface of the flexible non-magnetic substrate 6 as shown in FIG. 3, the magnetic elements 4 may be embedded, partially or fully, in the flexible non-magnetic substrate 6. The embedding may be achieved, for example, by over-moulding in rubber or via 3D printing.

In certain cases, the magnetic elements 4 may be skewed at an angle relative to the longitudinal axis of the at least partially magnet core 3, for example the magnetic elements may have a longitudinal axis that is not parallel nor orthogonal to the longitudinal axis of the flexible non-magnetic substrate 6. In these cases, adjacent magnetic elements 4 may overlap one another in a common plane.

In another embodiment, the plurality of magnetic elements 4 are arranged in at least two layers 7, 8, wherein each layer of magnetic elements 7, 8 is disposed at least partially within the flexible non-magnetic substrate 6, such that each magnetic element 4 in a layer 7, 8 overlaps with a magnetic element 4 in an adjacent layer 7, 8.

An effective magnetic permeability $\mu_{comp}$ of the example composite core 3 shown in FIG. 3 may be given by:

$$\mu_{comp} = \frac{\mu_{mat}}{\frac{2g \cdot t}{o \cdot s}\mu_{mat} + 1}$$

where: $\mu_{mat}$ is the magnetic permeability of the magnetic elements; g is the distance between magnetic elements 4 in different layers 7, 8; t is the thickness of the magnetic elements; o is the length of the overlap region 5, along a longitudinal axis of the core 3, between magnetic elements 4 in different layers 7, 8; and s is the length of the magnetic elements along the longitudinal axis of the core 3. In some examples, the quantities g, t, o, and s may be averaged over the entire core 3. In other examples, the magnetic elements 4 may be uniform and arranged homogeneously along the length of the at least partially magnetic core 3, such that these quantities will have substantially the same value for each magnetic element 4 and each relationship between magnetic elements 4.

The quantity 2g·t/o may be considered to be an effective gap length of the at least partially magnetic core 3 comprising two layers 7, 8 of magnetic elements 4 (analogous effective gap length expressions may be specified for partially magnetic cores 3 comprising a different number of layers 7, 8). For example, when comparing the above equation for the effective magnetic permeability $\mu_{comp}$ of the composite core 3 shown in FIG. 3 to the general equation for effective magnetic permeability $\mu_{eff}$ of a core with a gap, it can be seen that the ratios $l_{gap}/l_{core}$ and 2g·t/o·s are related. In an at least partially magnetic core 3 made up of multiple uniform elements, each of length e, the length s of a magnetic element 4 is related to the total effective length of the magnetic elements 4 in the core 3 by a factor of e. This factor is cancelled out when multiplying the effective gap length for an element (2g·t/o) by e.

In some embodiments, the ratio g/o of: the average distance g between the first and second layers 7, 8 of magnetic elements 4; and the average overlap o between magnetic elements 4 in the first and second layers 7, 8; is maintained during flexing of the flexible electrical current sensor 1. For example the ratio g/o may be maintained during flexing to within 10% of a value at rest, in other words when the sensor is unflexed. Thus, by using magnetic elements 4 with uniform thickness t, the effective gap length of the at least partially magnetic core 3, and therefore its effective magnetic permeability $\mu_{comp}$, may be kept constant. This allows for the linearity of the relationship between B and H, and between $V_{out}$ and $I_{in}$ to be maintained throughout the at least partially magnetic core 3, and during flexing of the electrical current sensor 1. The magnetic elements 4 may also have a high relative magnetic permeability of at least 500, 1000 or 10,000. This allows for high sensitivity of the electrical current sensor 1, with measurements of below 1 mA possible, while being flexible so that it can be wrapped around a current-carrying structure, and thus useful in a wide range of applications.

Figure 4A:
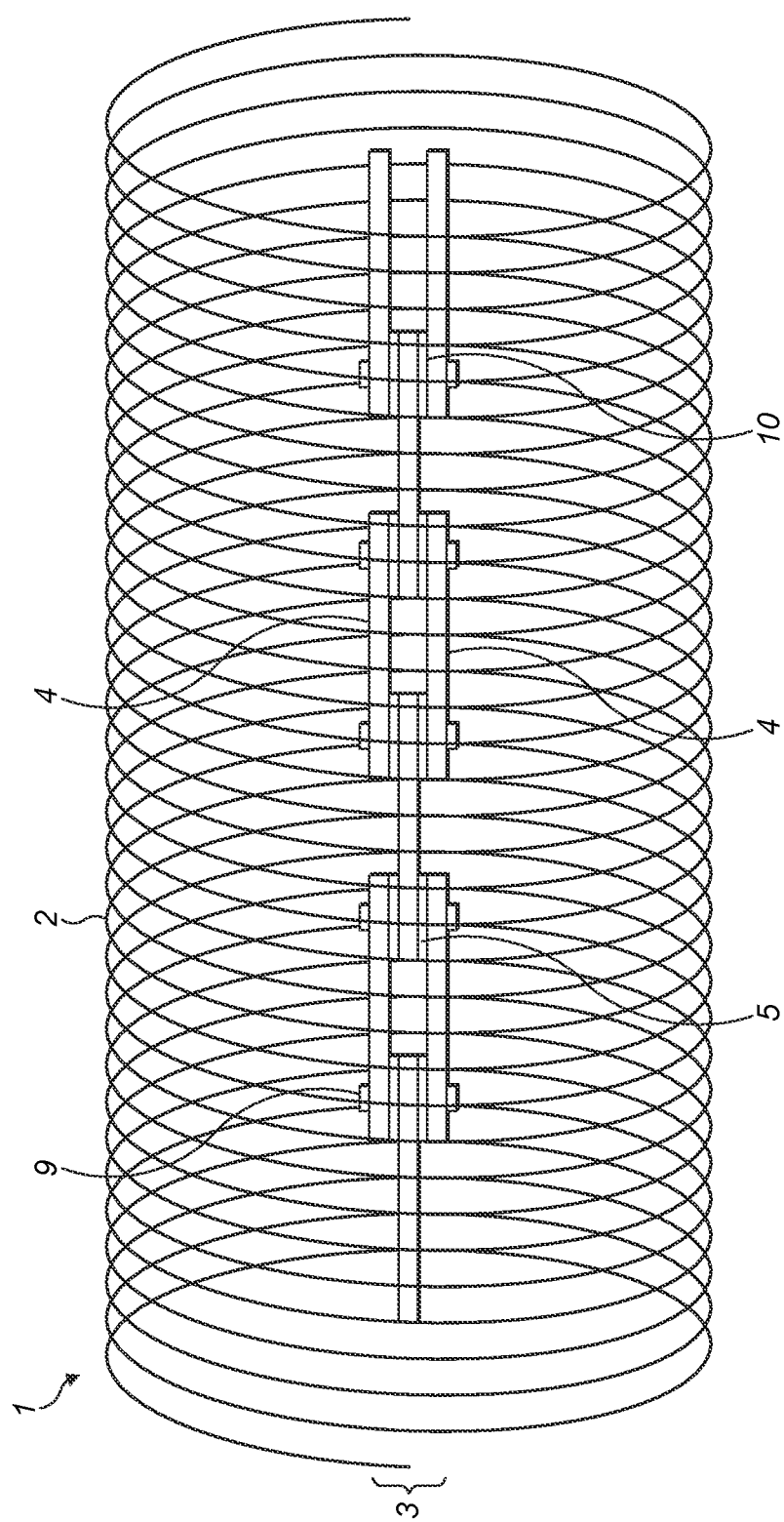
FIG. 4a is a schematic diagram of a side-on view of a flexible current sensor according to embodiments of the invention.
Figure 4B:
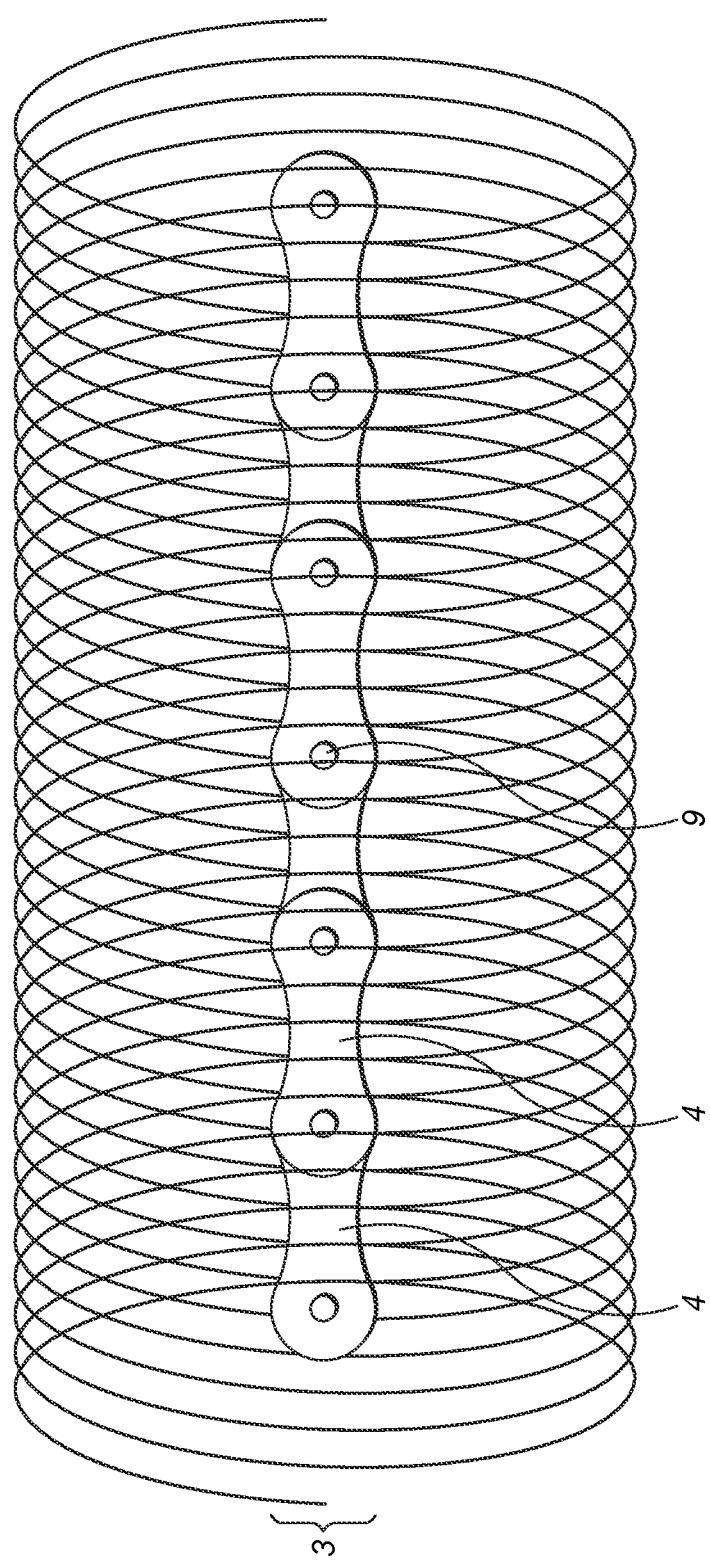

FIGS. 4a and 4b show an embodiment wherein the magnetic elements 4 are arranged in two layers such that each magnetic element 4 in a layer overlaps with a magnetic element 4 in an adjacent layer. Each magnetic element 4 is arranged to pivot about a point 9 in a region of overlap 5 with another magnetic element 4. FIG. 4a shows a side-on view of the sensor 1, while FIG. 4b shows a top-down or "birds-eye" view. In some examples, there are more than two layers of magnetic elements 4.

In the embodiment shown in FIGS. 4a and 4b, there are non-magnetic spacers 10 between overlapping magnetic elements 4, and the non-magnetic spacers 10 are positioned in the regions of overlap 5. Thus, pivoting of the magnetic elements 4 provides the flexibility of the partially magnetic core 3 and electrical current sensor 1 as a whole.

In other embodiments, the magnetic elements 4 may be arranged in more than two layers such that magnetic elements 4 in a layer overlap with magnetic elements 4 in another of the layers.

In other embodiments, the magnetic elements 4 may be arranged in a single layer, for example, a series of magnetic elements 4 connected to one another by non-magnetic pivots 9.

Figure 5:
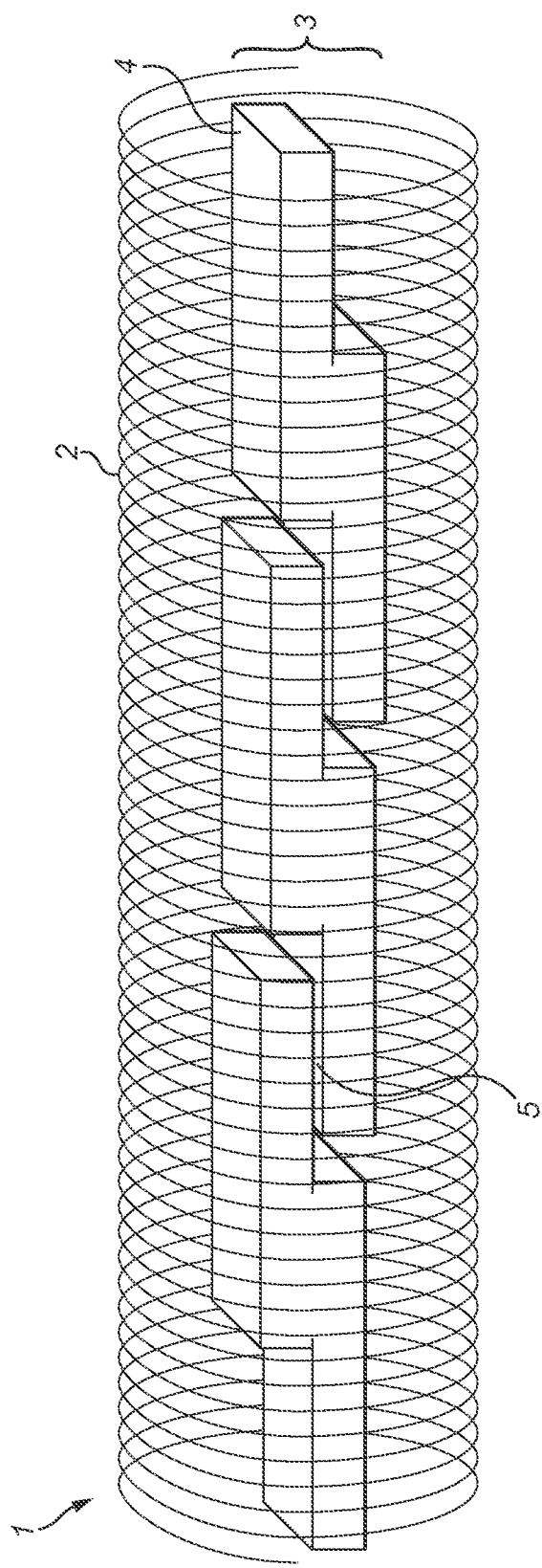
FIG. 5 is a schematic diagram of a perspective view of a flexible current sensor according to embodiments of the invention.

FIG. 5 shows an embodiment where the at least partially magnetic core 3 comprises a plurality of magnetic elements 4 arranged in a single layer and shaped such that adjacent magnetic elements 4 in the single layer overlap. Regions of overlap 5 may be present where adjacent magnetic elements 4 overlap one another due to their shape, for example an 'S' or 'Z' shape, as shown in FIG. 5. Adjacent magnetic elements 4 may be arranged to pivot with respect to one another, for example about a common pivot point in a region of overlap 5.

Figure 6:
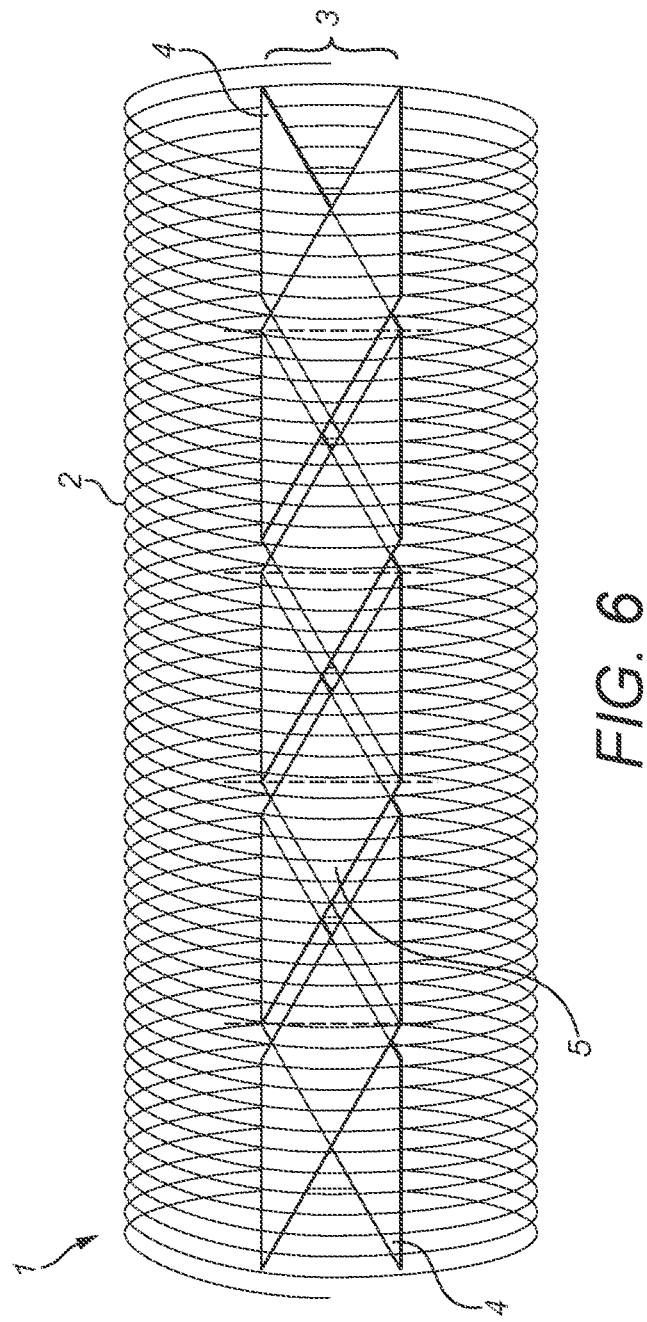
FIG. 6 is a schematic diagram of a top-down view of a flexible current sensor according to embodiments of the invention.

FIG. 6 shows an embodiment where the flexible electrical current sensor 1 comprises two magnetic elements 4 arranged as intertwining strips. The intertwined magnetic elements 4 may have regions of overlap 5 where the strips overlap one another, as shown in FIG. 6.

In other embodiments, the magnetic elements 4 may be arranged as rhombic- or parallelogrammatic-shaped strips in one or more layers. In other cases, the strips arranged in one or more layers may be another shape, such as round circles or ovals.

Figure 7:
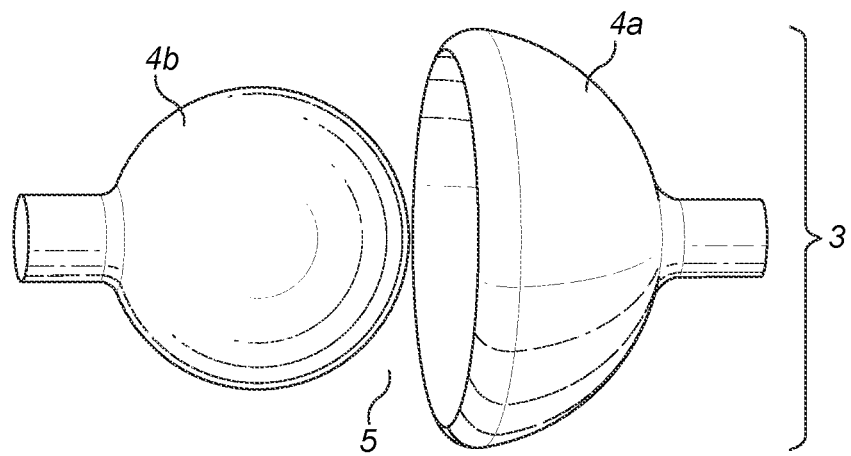
FIG. 7 is a schematic diagram of a perspective view of an at least partly magnetic core for a flexible current sensor according to embodiments of the invention.

FIG. 7 shows an embodiment where the at least partially magnetic core 3 comprises magnetic elements 4a, 4b in a ball-and-socket arrangement. There is a region of overlap 5 where the socket magnetic element 4a covers part of the ball magnetic element 4b, as shown in FIG. 7. In some embodiments, the at least partially magnetic core 3 may comprise a series of such magnetic elements 4a, 4b in a ball-and-socket arrangement. In some embodiments, for example, the at least partially magnetic core 3 may comprise a series of magnetic elements, of which at least some comprise a socket end resembling the socket element 4a shown in FIG. 7, and a ball end resembling the ball magnetic element 4b shown in FIG. 7, such that a ball-and-socket arrangement is provided at each boundary between consecutive magnetic elements.

The ball-and-socket arrangement of the magnetic elements 4a, 4b allows the at least partially magnetic core 3 to flex, as the magnetic elements 4a, 4b may move relative to one another.

A flexible electrical current sensor may be formed from a solenoid disposed about the at least partially magnetic core 3 shown in FIG. 7, or a series of such magnetic elements 4a, 4b, as in the embodiments shown in the FIGS. 1 to 6.

Figure 8:
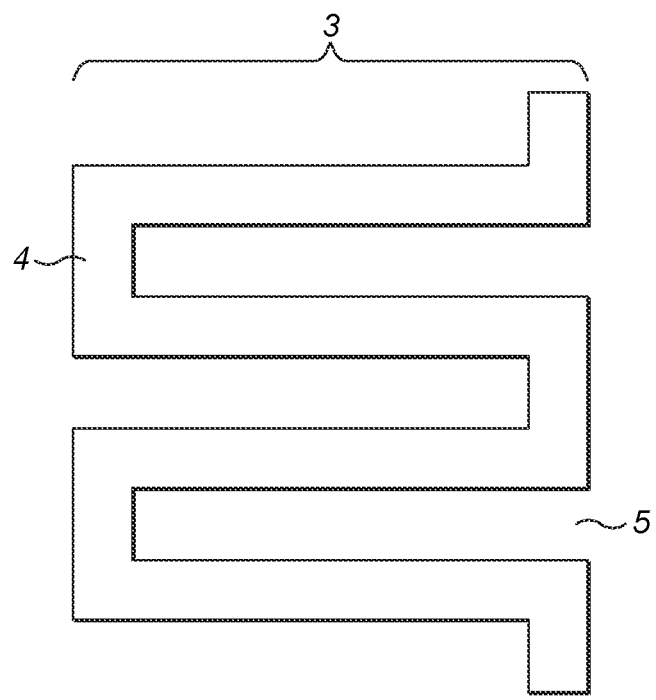
FIG. 8 is a schematic diagram of a top-down view of an at least partly magnetic core for a flexible current sensor according to embodiments of the invention.

FIG. 8 shows a top-down view of an embodiment where the at least partially magnetic core 3 comprises one magnetic element 4 arranged in a layer and configured to provide regions of overlap 5 where the magnetic element 4 overlaps itself in the layer. For example, the magnetic element 4 may be meandered as shown in FIG. 8 to provide regions of overlap 5 where the magnetic element 4 overlaps itself.

The flexible current sensor 1 according to any of the described embodiments may be elongate for forming a ring or loop around a current-carrying device or structure. In some examples, the magnetic element(s) may be elongate. The longitudinal axis of such elongate magnetic element(s) may be substantially parallel to a longitudinal axis of the at least partially magnetic core and/or the flexible current sensor 1 in an un-flexed rest state.

Figure 9A:
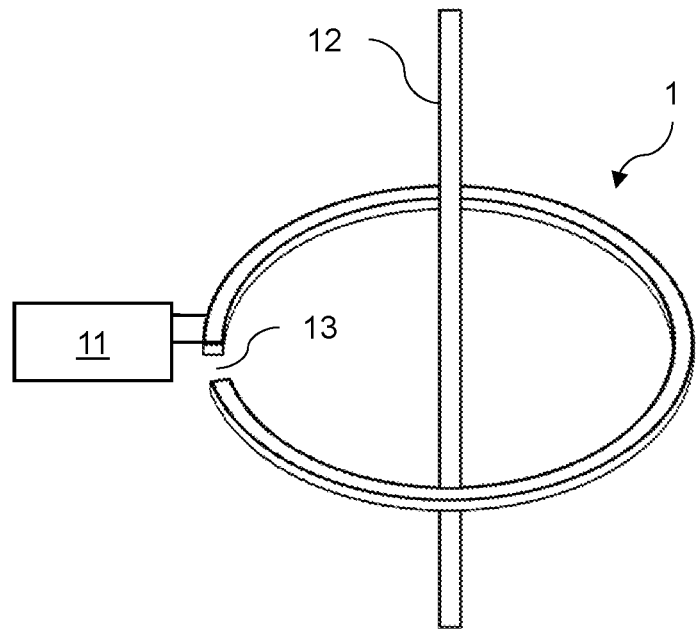
FIG. 9a is a schematic diagram of a perspective view of a test apparatus comprising a flexible current sensor according to embodiments of the invention.
Figure 9B:
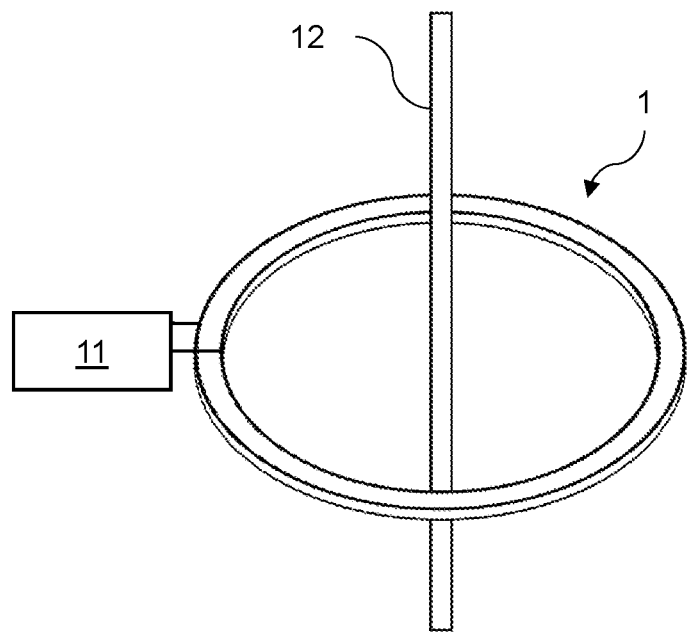
FIG. 9b is a schematic diagram of a perspective view of the test apparatus shown in FIG. 9a in a different configuration.

FIGS. 9a and 9b show schematically a test apparatus comprising a flexible current sensor 1 according to any of the described embodiments connected to a test unit 11. The test unit 11 may display a measured current value, for example, and may have controls for controlling the test apparatus. The flexible current sensor 1, and where applicable the non-magnetic substrate 6, is sufficiently flexible to allow the flexible current sensor 1 to be opened sufficiently wide and arranged about a current-carrying structure 12 in some embodiments. For example, in the embodiment shown in FIG. 9a, the flexible current sensor 1 is flexed to create an opening 13 for the current-carrying structure 12 to be passed through. The flexible current sensor 1 may be flexed to close the opening 13 and form a closed loop, as shown in FIG. 9b, for measuring the current passing through the current-carrying structure 12. In other embodiments, the flexible current sensor 1, and where applicable the non-magnetic substrate 6, may be sufficiently flexible to allow the flexible current sensor 1 to be wrapped around the current-carrying structure 12 with multiple turns. In examples, the current-carrying structure 12 may be any conductor for example a wire, a cable, or a metallic structural member such as a support leg of an electricity pylon.

Figure 10:
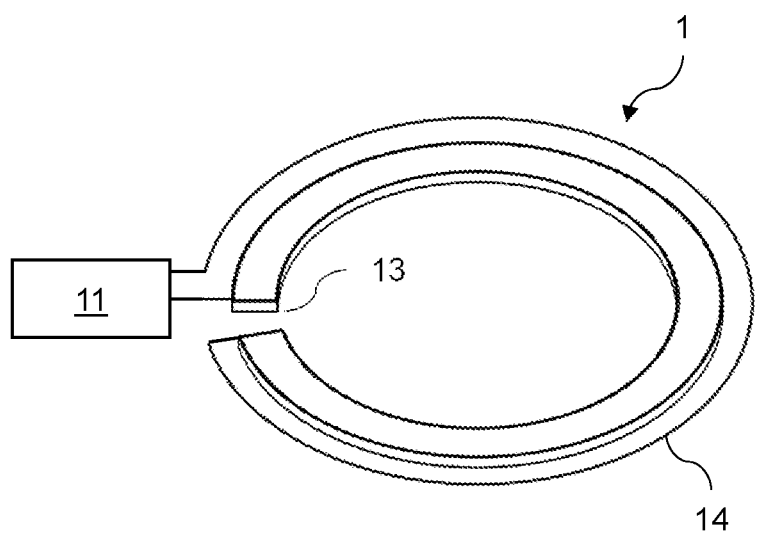
FIG. 10 is a schematic diagram of a perspective view of a test apparatus comprising a flexible current sensor according to embodiments of the invention.

FIG. 10 shows schematically a test apparatus comprising the flexible current sensor 1 according to any of the described embodiments connected to the test unit 11. The flexible current sensor comprises a return wire 14 connected to, or as part of, the solenoid 2 which is not shown in the figure. The return wire travels from an end of the solenoid at an end of the flexible current sensor 1 to the other end of the flexible current sensor 1. In this way, the opening 13 may be created by flexing the flexible current sensor 1, with the solenoid 2 and the return wire 14 not obstructing the opening 13, so that the flexible current sensor 1 may be arranged about a current-carrying structure. The return wire connects to the test unit 11 to complete a circuit with the other end of the solenoid 2 being connected to the test unit also.

In some examples, the flexible current sensor 1 may have a releasable joint to open and secure the ends of the flexible current sensor 1 at the opening 13.

In examples, a magnetic element 4 may be a magnetic member, such as a solid piece or strip of material that, as a whole, comprises magnetic properties. In other examples, a magnetic element 4 may be formed by a depression or cavity in the non-magnetic substrate 6 that is at least partially filled with a magnetic powder or liquid. For example, the concentration of magnetic powder or liquid having a defined boundary with the non-magnetic substrate 6 may be considered a magnetic element 4. A plurality of such cavities in the non-magnetic substrate 6, each at least partially filled with magnetic powder or liquid, may therefore be considered a plurality of magnetic elements 4.

In certain cases, the magnetic element(s) 4 described herein may have a relative magnetic permeability of at least 500, or at least 1,000, or at least 10,000. The magnetic element(s) may comprise magnetically soft material, for example iron (Fe), nickel (Ni), or cobalt (Co), or a mixture comprising at least two of these three metals such as a nickel-iron alloy. In an example, the magnetic elements(s) 4 are made from an alloy comprising 80% nickel and 20% iron. In other cases, the magnetic element(s) 4 may be formed from nanocrystalline or amorphous ribbon, or electrical steel, for example cut into strips. In other examples, the magnetic element(s) may comprise a ferrite, oxide, or powder-based material. In certain cases, the magnetic element(s) may be flexible. In these cases, the magnetic element(s) may flex when the at least partially magnetic core is flexed, with the effective magnetic permeability of the at least partially magnetic core maintained during flexing.

In any of the embodiments and examples described herein, the solenoid 2 disposed about the at least partially magnetic core 3 may have winding of a uniform pitch. As the value for the output voltage depends on a space integral over all turns i of the solenoid 2 up to the total number of turns N, a uniform winding of the solenoid 2 allows the same value for output voltage to be determined regardless of the position of the current sensor with respect to the electrical conductor being measured. Thus, in cases where the solenoid 2 has a winding of a uniform pitch, the present flexible current sensor 1 may be used more reliably, as its position relative to the electrical conductor being measured does not affect the measurement reading.

Flexible current sensors, according to examples described above, may be used in devices for measuring resistance or impedance for example, in devices for performing a measurement of resistance or impedance using the stake-less method. The stake-less method is used for measuring circuit resistance or impedance, to determine whether an earthing electrode has developed a fault, without the use of auxiliary test spikes. The method may comprise attaching a transformer and a current-sensor to a circuit comprising an earthing electrode to be tested, either directly at the electrode or elsewhere in the circuit. The transformer may be attached to the circuit such that a current may be induced in the circuit comprising the earthing electrode under test by applying a predetermined voltage across a primary winding of the transformer. Applying the voltage across the primary winding of the transformer will generate a magnetic field in the core of the transformer. This magnetic field may induce the current in the circuit to be tested. As the number of turns in the primary winding of the transformer is predetermined, and taking the number of turns of the circuit through the transformer to be one, the voltage induced in the circuit can be determined based on the input voltage and the turn ratio.

The current sensor may then measure the current induced in the circuit. By applying a constant voltage across the primary winding of the transformer, the current induced in the circuit may be directly proportional to the resistance or impedance of the circuit which is being measured. Hence, a determination of the resistance or impedance in the circuit comprising the earthing electrode may be made.

Figure 11:
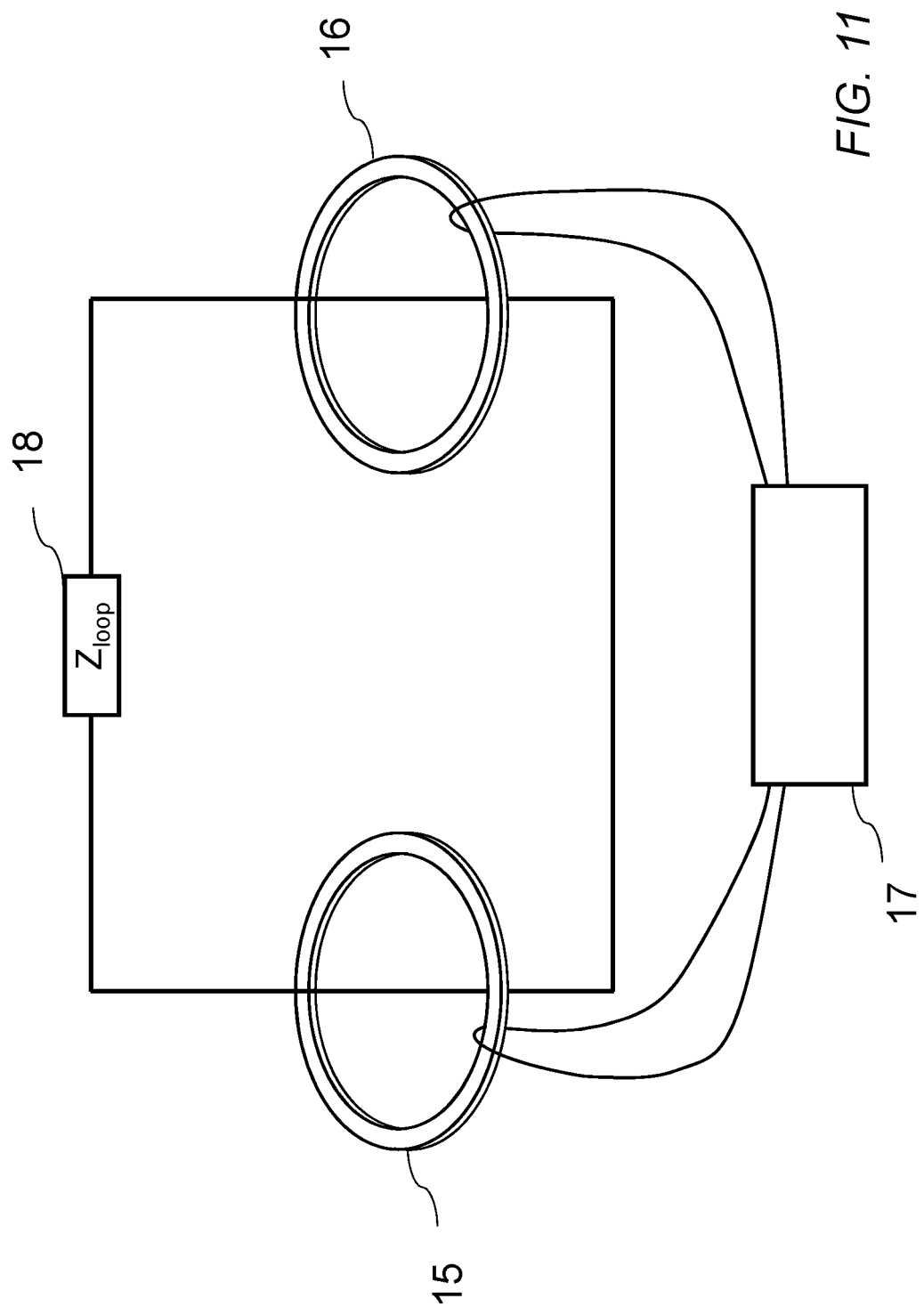
FIG. 11 is a schematic diagram of a test apparatus in use according to embodiments of the invention.

FIG. 11 shows an example of a device for measuring resistance or impedance. The device comprises a voltage-inducing loop 15, a current-sensing loop 16, and a test unit 17. A circuit to be tested has an impedance indicated by $Z_{loop}$ 18. The voltage-inducing loop 15 may be used to induce a voltage in the circuit. The circuit may represent a circuit comprising an earthing electrode wherein the impedance of the circuit is to be tested. In some examples, the voltage-inducing loop 15 may comprise the flexible current sensor according to the examples described herein configured as such. A current sensor according to the examples described herein may be reconfigured to be a voltage-inducing loop 15 by applying a predetermined voltage across the solenoid, wherein the example voltage-inducing loop 15 shown in FIG. 11 comprises a solenoid with one turn. However, in practice the solenoid may comprise a plurality of turns for example as shown in FIG. 1. Applying a predetermined voltage across the solenoid of the current sensor in the voltage-inducing loop 15 may cause a magnetic field to be generated in the at least partially magnetic core of the voltage-inducing loop 15. With the current sensor positioned around a conductor in the circuit, a current may be induced in the circuit. The current induced in the circuit being related to the voltage applied across the solenoid and the impedance of the circuit.

In some examples the current-sensing loop 16 may comprise the current sensor according to examples described herein. The current-sensing loop 16 being configured as a current sensor according to examples described above, wherein the examples shown in FIG. 11 comprises a solenoid with one turn. However, in practice the solenoid may comprise a plurality of turns for example as shown in FIG. 1. With the current-sensing loop 16 positioned around a current carrying conductor, a magnetic field, proportional to the current in the current carrying conductor and the turn ratio between the circuit and the solenoid in the current-sensing loop 16, is generated in the at least partially magnetic core of the current sensor. This in turn may be sensed using a solenoid, comprising at least one winding, positioned around the at least partially magnetic core and connected to the test unit 17.

The test unit 17 shown in FIG. 11 may comprise a voltage source for applying a predetermined voltage across the solenoid of the voltage-inducing loop 15. The test unit may comprise a signal processing unit to measure a signal output from the current-sensing loop. The signal output may be used to determine the current in the circuit under test. The signal processing unit may also receive an indication of the voltage across the solenoid in the voltage-inducing loop 15 and thereby may be configured to determine the resistance or impedance in the circuit under test based on the turn ratios, the applied voltage and the measured current. In some examples the signal processing unit may determine any information relating to; resistance, reactance, impedance, phase, and waveform in the circuit under test. In some examples the signal processing unit comprises the voltage source.

In some examples the voltage-inducing loop 15 and the current-sensing loop 15 are connected to separate test units, wherein the test unit connected to the voltage-inducing loop may comprise a voltage source and the test unit connected to the current-sensing loop may comprise a signal processing unit. The two test units may be connected to each other or connected to a computing device either by wires or wirelessly by the use of any number of wireless communication devices. Wherein any of the two test units or the computing device may determine the resistance or impedance in the circuit under test based on the predetermined voltage, the signals received by the signal processing unit, and other information relating to the device such as turn ratios for the voltage-inducing loop and the current-sensing loop.

In some examples, at least one of the voltage-inducing loop 15 and current-sensing loop 16 may comprise a flexible current sensor according to examples described herein. In other examples both the voltage-inducing loop 15 and current-sensing loop 16 may comprise a current sensor according to the examples described above, configured respectively.

At least one of the voltage-inducing loop 15 and the current-sensing loop 16 may comprise a closure mechanism to secure the ends of the respective loop when positioned around a conductor in a circuit to be tested. The closure mechanism may comprise at least partially magnetic material to provide an improved magnetic path between the ends of the loop.

Figure 12:
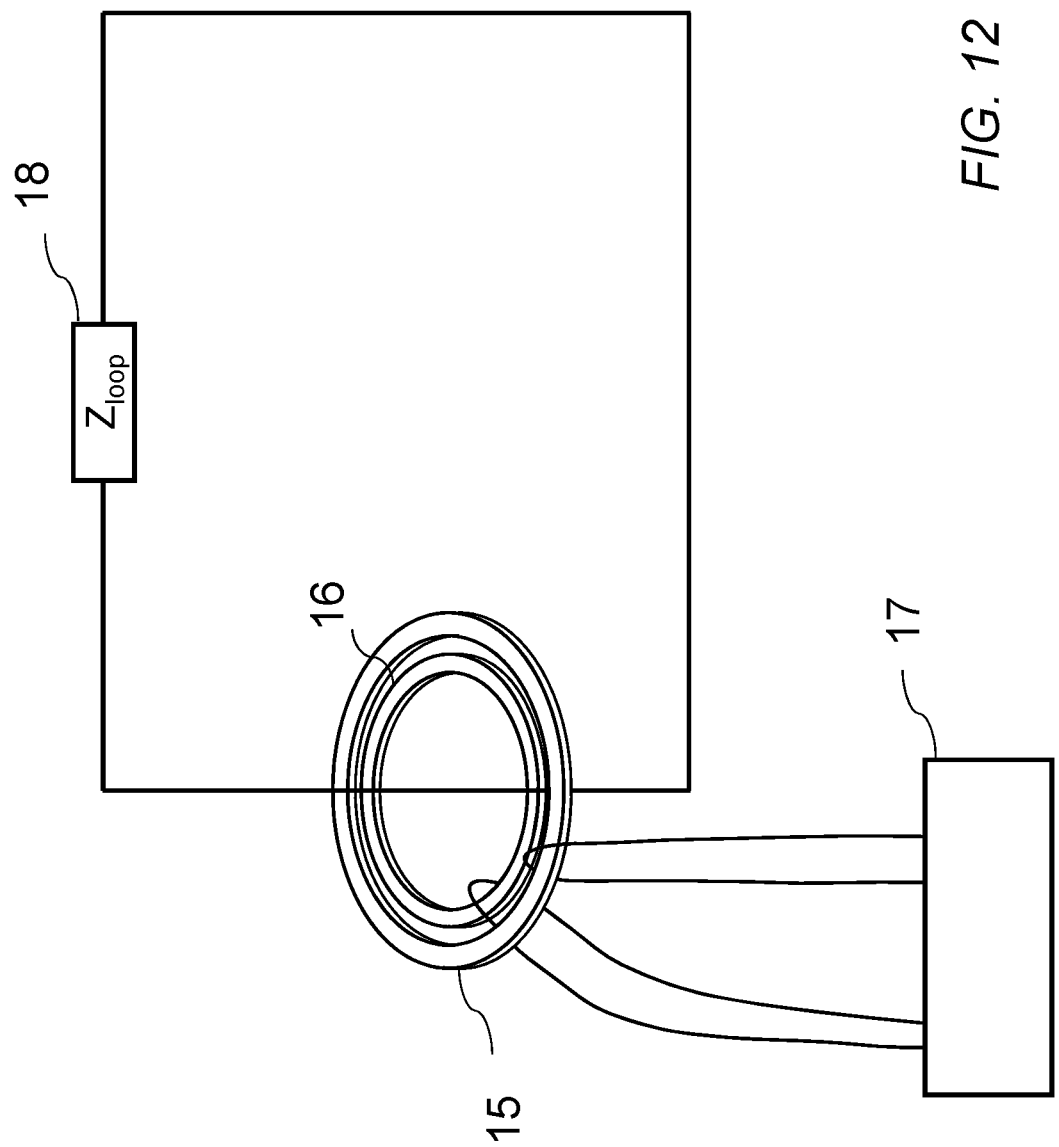
FIG. 12 is a schematic diagram of a test apparatus in use according to embodiments of the invention.

The voltage-inducing loop 15 and the current sensing loop 16 may be connected either at a shared closure mechanism or by an insulating portion of each loop. The voltage-inducing loop and the current-sensing loop may each comprise an outer layer of insulating material. The voltage-inducing loop and the current sensing loop may comprise a single outer layer of insulating material, thereby joining the two loops. There may be a layer of insulating material between the voltage-inducing loop and the current-sensing loop. Many arrangements of the voltage-inducing loop and the current sensing loop are possible. For example, FIG. 12 shows a configuration wherein the voltage-inducing loop and current-sensing loop are concentric and coplanar. This configuration may be implemented in devices wherein the voltage-inducing loop and the current-sensing loop comprise an outer layer of insulating material. This may allow the voltage-inducing loop and the current-sensing loop of the device to be positioned around current carrying conductors which are positioned within openings narrower than the combined width of the loops. In some examples, the voltage-inducing loop and the current-sensing loop may be concentric but may not lie in the same plane. In other examples, the voltage-inducing loop and the current sensing loop may be adjacent to one another in different planes. The voltage-inducing loop and the current-sensing loop may have the same radius, or their radii may differ. The cross section of voltage-inducing loop and the current-sensing loop may differ for example, the voltage-inducing loop may have a larger cross section than the current-sensing loop or vice versa.

In some examples, the device may compensate for magnetic interference between the voltage-inducing loop and the current-sensing loop. The current-sensing loop may comprise a secondary winding around the core of the current-sensing loop and connected to a signal source or wound around the voltage-inducing loop. The secondary winding may have a configurable impedance implemented by the inclusion of other electrical equipment. The winding is configured such that it generates a magnetic field of equal magnitude but opposite polarity to the field induced in the core of the current-sensing loop by the interference from the voltage-inducing loop. In some examples, the device may compensate for electrical interference between the voltage-inducing loop and the current-sensing loop. The device may comprise an auxiliary signal source. The auxiliary signal source may be tapped from the voltage-inducing loop to achieve the correct compensation. The device may comprise a parasitic winding around the voltage-inducing loop, where the auxiliary circuit containing this parasitic winding has a configurable impedance. An analogue-to-digital converter may be used to digitise the signal output from the current-sensing loop and an algorithm can be applied to the digitised signal.

Using a flexible current sensor according to the examples described above in at least one of the voltage-inducing loop and current-sensing loop may allow the voltage-inducing loop and current-sensing loop to be positioned around a conductor such as the foot of a pylon, or an earthing electrode with a diameter larger than 100 millimetres.

What is claimed is:

1. A flexible electrical current sensor comprising a solenoid disposed about an at least partially magnetic core, the at least partially magnetic core comprising at least one magnetic element,
    wherein the at least one magnetic element is configured to provide one or more regions of overlap such that a respective gap is provided in each region of overlap, each respective gap being configured such that the effective magnetic permeability of the at least partially magnetic core is maintained during flexing.

2. A flexible electrical current sensor according to claim 1, wherein each respective gap is configured to maintain a substantially constant volume of the respective region of overlap provided by the at least one magnetic element.

3. A flexible electrical current sensor according to claim 1, the at least partially magnetic core comprising a flexible non-magnetic substrate.

4. A flexible electrical current sensor according to claim 3 wherein the at least partially magnetic core comprises a plurality of magnetic elements, and the magnetic elements are arranged in at least one layer disposed on the flexible non-magnetic substrate.

5. A flexible electrical current sensor according to claim 4, wherein the layer of magnetic elements is a first layer of magnetic elements disposed on a first side of the flexible non-magnetic substrate, and the at least partially magnetic core further comprises a second layer of magnetic elements disposed on an opposite side to the first side of the flexible non-magnetic substrate.

6. A flexible electrical current sensor according to claim 5, wherein a ratio g/o of the average distance between the first and second layers of magnetic elements g, and the average overlap between magnetic elements in the first and second layers o, is maintained during flexing.

7. A flexible electrical current sensor according to claim 3 wherein the at least partially magnetic core comprises a plurality of magnetic elements, and the magnetic elements are arranged in at least one layer disposed at least partially within the flexible non-magnetic substrate.

8. A flexible electrical current sensor according to claim 3 wherein the at least partially magnetic core comprises a plurality of magnetic elements, and the magnetic elements are arranged in at least two layers, wherein each layer of magnetic elements is disposed at least partially within the flexible non-magnetic substrate, such that each magnetic element in a layer overlaps with a magnetic element in an adjacent layer and is arranged to pivot about a point in a region of overlap with the magnetic element in the adjacent layer.

9. A flexible electrical current sensor according to claim 8 comprising non-magnetic spacers between overlapping magnetic elements, wherein the non-magnetic spacers are positioned in the regions of overlap.

10. A flexible electrical current sensor according to claim 1, comprising a plurality of magnetic elements arranged in a single layer and shaped such that adjacent magnetic elements in the single layer overlap.

11. A flexible electrical current sensor according to claim 1, comprising one magnetic element arranged substantially helically.

12. A flexible electrical current sensor according to claim 1, comprising two magnetic elements arranged as intertwining strips.

13. A flexible electrical current sensor according to claim 1, wherein the solenoid comprises winding of a uniform pitch.

14. A flexible electrical current sensor according to claim 1, the at least one magnetic element having a relative magnetic permeability of at least 500.

15. A flexible electrical current sensor according to claim 14, the at least one magnetic element having a relative magnetic permeability of at least 10,000.

16. A flexible electrical current sensor according to claim 1, wherein the at least one magnetic element comprises magnetically soft material.

17. A flexible electrical current sensor according to claim 16, wherein the at least one magnetic element comprises a ferrite, electrical steel, nickel-iron alloy, or a nanocrystalline or amorphous ribbon.

18. A device to measure at least one of electrical resistance and electrical impedance, the device comprising:
    a voltage-inducing loop; and
    a current-sensing loop;
    wherein at least one of the voltage-inducing loop and the current-sensing loop comprises the flexible electrical current sensor according to any preceding claim configured as such.

19. A device to measure at least one of electrical resistance and electrical impedance according to claim 18, wherein the voltage-inducing loop and the current-sensing loop are at least one of concentric and coplanar.

20. A device to measure at least one of electrical resistance and electrical impedance according to claim 18, comprising a voltage source to supply a predetermined voltage to the voltage-inducing loop and a signal processing unit to measure a signal output from the current-sensing loop.

* * * * *